(12) United States Patent
Qin et al.

(10) Patent No.: US 8,818,313 B2
(45) Date of Patent: Aug. 26, 2014

(54) METHOD AND APPARATUS FOR AUTO GAIN CONTROL IN RADIO RECEIVER

(71) Applicant: Huawei Technologies Co., Ltd., Shenzhen (CN)

(72) Inventors: Jianhua Qin, Beijing (CN); Junshi Chen, Beijing (CN); Yunbao Zeng, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/964,952

(22) Filed: Aug. 12, 2013

(65) Prior Publication Data

US 2013/0324065 A1   Dec. 5, 2013

Related U.S. Application Data

(63) Continuation of application No. PCT/CN2011/072739, filed on Apr. 13, 2011.

(51) Int. Cl.
  *H04B 1/06* (2006.01)
  *H04W 52/52* (2009.01)
  *H04W 52/24* (2009.01)
  *H04W 52/04* (2009.01)
  *H03G 3/20* (2006.01)

(52) U.S. Cl.
  CPC ............... *H03G 3/20* (2013.01); *H04W 52/52* (2013.01); *H04W 52/243* (2013.01); *H04W 52/04* (2013.01)
  USPC ........ 455/232.1; 455/130; 455/136; 455/138; 455/234.1

(58) Field of Classification Search
  CPC ........... H04B 1/10; H04B 1/1027; H03G 3/20
  USPC ........ 455/130, 136, 138, 232.1, 234.1, 240.1, 455/245.1
  See application file for complete search history.

(56) References Cited

U.S. PATENT DOCUMENTS

| | | | |
|---|---|---|---|
| 6,556,636 B1 | 4/2003 | Takagi | |
| 7,076,225 B2 | 7/2006 | Holenstein et al. | |

(Continued)

FOREIGN PATENT DOCUMENTS

| | | |
|---|---|---|
| CN | 1305270 A | 7/2001 |
| CN | 1774080 A | 5/2006 |

(Continued)

OTHER PUBLICATIONS

Foreign Communication From a Counterpart Application, PCT Application No. PCT/CN2011/072739, Chinese Search Report dated Oct. 13, 2011, 7 pages.

(Continued)

*Primary Examiner* — Tuan Pham
(74) *Attorney, Agent, or Firm* — Conley Rose, P.C.; Grant Rodolph; Nichloas K. Beaulieu

(57) ABSTRACT

The present invention relates to the field of communication technologies and discloses a method and an apparatus for auto gain control (AGC) in a radio receiver, which can ensure that a radio frequency device, an analog device, and various nodes in a digital domain are non-saturated and that useful signal power is adjusted to a certain power level. According to the present invention, total signal power on an air interface is subtracted from a preset first target power to obtain an analog auto gain control (AAGC) gain, and then a second target power is subtracted from an interference signal power in a digital baseband to obtain a digital auto gain control (DAGC) gain.

10 Claims, 4 Drawing Sheets

(56) References Cited

U.S. PATENT DOCUMENTS

| | | |
|---|---|---|
| 7,483,500 B2 | 1/2009 | Takatz et al. |
| 2001/0003536 A1 | 6/2001 | Kurihara |
| 2003/0194981 A1* | 10/2003 | Rimini et al. ............... 455/234.1 |
| 2004/0152432 A1* | 8/2004 | Gu ................................ 455/136 |
| 2006/0002494 A1* | 1/2006 | Zhang ........................... 375/345 |
| 2006/0176985 A1 | 8/2006 | Tandon et al. |
| 2006/0188042 A1 | 8/2006 | Takatz et al. |
| 2007/0071149 A1 | 3/2007 | Li et al. |
| 2007/0229340 A1 | 10/2007 | Krishnamoorthi et al. |
| 2010/0034327 A1 | 2/2010 | Rimini et al. |

FOREIGN PATENT DOCUMENTS

| | | |
|---|---|---|
| CN | 1812257 A | 8/2006 |
| CN | 101567672 A | 10/2009 |
| CN | 101964774 A | 2/2011 |
| EP | 2010336 A2 | 1/2009 |

OTHER PUBLICATIONS

Foreign Communication From a Counterpart Application, PCT Application No. PCT/CN2011/072739, Chinese Written Opinion dated Oct. 13, 2011, 4 pages.

Foreign Communication From a Counterpart Application, Chinese Application No. 201180000313.1, Chinese Search Report dated Sep. 21, 2012, 2 pages.

* cited by examiner

METHOD AND APPARATUS FOR AUTO GAIN CONTROL IN RADIO RECEIVER

CROSS-REFERENCE TO RELATED APPLICATIONS

This application is a continuation of International Application No. PCT/CN2011/072739, filed on Apr. 13, 2011, which is hereby incorporated by reference in its entirety.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to the field of communication technologies, and in particular, to a method and an apparatus for auto gain control (AGC) in a radio receiver.

BACKGROUND

In a communication process, power of a signal often changes over time because of factors such as channel fading, load magnitude, and power control, so that a communication receiver is required to have a certain reception range to ensure correct reception of the signal. AGC may maintain power of a received signal within a stable range, and by predicting signal power in a future time period, generate an appropriate amplification gain so that a signal at an input port of an ADC (Analog Digital Converter, analog-to-digital converter) or in a digital domain is stabilized at a basically-fixed power level or within a small dynamic range of power levels. When an AGC gain to be used in a next period is obtained, two functions need to be ensured at the same time:

1. A radio frequency device and an analog device and various nodes in the digital domain need to be non-saturated or as less saturated as possible.
2. Useful signal power is adjusted to a certain power level to reduce a dynamic range of the received signal power.

In the prior art, the AGC gain used for the next period is obtained using the following three schemes:

Scheme I: Set signal power of a target Received Signal Strength Indication (RSSI) that collects statistics about signal power of a current wideband RSSI (WB-RSSI), and then calculate the AGC gain that may be used in the next period by subtracting the signal power of the WB-RSSI from the target RSSI and adding a currently-used gain. When blocking is caused by presence of strong signal interference, this segment of signals may be discarded. The WB-RSSI refers to a RSSI obtained by collecting statistics about data that has undergone ADC conversion, and the RSSI obtained by collecting statistics includes signal power outside a useful signal bandwidth.

Scheme II: Set signal power of a target RSSI, collect statistics about signal power of a current narrowband RSSI (NB-RSSI), and then calculate the AGC gain that may be used in the next period by subtracting the signal power of the NB-RSSI from the signal power of the target RSSI and adding a currently-used gain. When blocking is caused by presence of strong signal interference, this segment of signals may be discarded. The NB-RSSI refers to a RSSI obtained by collecting statistics about data that has passed through a filter, and the RSSI obtained by collecting statistics does not include signal power outside a useful signal bandwidth.

Scheme III: First, allow a power level of a useful signal to fluctuate within a certain dynamic range, determine a target power range of the useful signal, subsequently collect statistics about signal power of a current NB-RSSI, and obtain an acceptable AGC gain range by subtracting the signal power of the NB-RSSI from the target power range of the useful signal; then, collect statistics about signal power of a current WB-RSSI and calculate a non-saturated AGC gain range according to the signal power of the WB-RSSI; finally, obtain an intersection of the acceptable AGC gain range and the non-saturated AGC gain range to determine any point in the intersection to be the AGC gain that may be used in the next period.

However, in the first scheme of the prior art, the use of the WB-RSSI can only ensure that the radio frequency device and the analog device and the various nodes in the digital domain are non-saturated; in the second scheme, the use of the NB-RSSI can only ensure that the useful signal power is adjusted to a certain power level to reduce the dynamic range of the received signal power; and in the third scheme, both the WB-RSSI and the NB-RSSI are used, and when the signal interference is very strong, it is possible to calculate that there is no intersection between the acceptable AGC gain range and the non-saturated AGC gain range so that the AGC gain that may be used in the next period cannot be determined.

Therefore, when the AGC gain used for the next period is obtained in the foregoing three schemes of the prior art, it cannot be ensured that the radio frequency device and the analog device and the various nodes in the digital domain are non-saturated and that the useful signal power is adjusted to a certain power level at the same time.

SUMMARY

Embodiments of the present invention provide an AGC method and an AGC apparatus in a radio receiver, which may ensure that a radio frequency device and an analog device and various nodes in a digital domain are non-saturated and that useful signal power is adjusted to a certain power level.

To achieve the foregoing objective, the embodiments of the present invention adopt the following technical solutions:

An AGC method in a radio receiver includes: subtracting total signal power on an air interface from preset first target power to obtain an analog auto gain control (AAGC) gain; subtracting second target power from interference signal power in a digital baseband to obtain a digital auto gain control (DAGC) gain; performing analog processing and analog-to-digital conversion on an analog signal of the radio receiver to obtain a digital signal, where in the analog processing, the AAGC gain is used to perform gain control over the analog signal; and performing digital processing on the digital signal to obtain a processing result, where in the digital processing, the DAGC gain is used to perform gain control over the digital signal.

An AGC apparatus in a radio receiver includes: a processor, configured to subtract total signal power on an air interface from preset first target power to obtain an AAGC gain, and subtract second target power from interference signal power in a digital baseband to obtain a DAGC gain; an analog signal processing unit, configured to perform analog processing and analog-to-digital conversion on an analog signal of the radio receiver to obtain a digital signal, where in the analog processing, the AAGC gain is used to perform gain control over the analog signal; and a digital signal processing unit coupled to the analog signal processing unit, and configured to perform digital processing on the digital signal to obtain a processing result, where in the digital processing, the DAGC gain is used to perform gain control over the digital signal.

With the AGC method and the AGC apparatus in a radio receiver according to the embodiments of the present invention, an original AGC function is divided into two parts for implementation: first, the total signal power on the air interface is subtracted from the preset first target power to obtain the AAGC gain, thus implementing the function of preventing the radio frequency device and the analog device and the various nodes in the digital domain from saturation; and then the second target power is subtracted from the interference signal power in the digital baseband to obtain the DAGC gain, thus implementing the function of adjusting the useful signal power to a certain power level. Compared with the prior art, the solutions provided in the embodiments of the present invention may ensure that the radio frequency device and the analog device and the various nodes in the digital domain are non-saturated and that the useful signal power is adjusted to a certain power level.

BRIEF DESCRIPTION OF THE DRAWINGS

To make the technical solutions of the embodiments of the present invention clearer, accompanying drawings used in the description of the embodiments are briefly described below. Evidently, the accompanying drawings in the following description are merely some embodiments of the present invention, and persons of ordinary skill in the art may further obtain other drawings according to these accompanying drawings without creative efforts.

DETAILED DESCRIPTION

The technical solutions of the embodiments of the present invention are described clearly and completely with reference to the accompanying drawings in the embodiments of the present invention. Obviously, the embodiments to be described are merely part of rather than all of the embodiments of the present invention. All other embodiments obtained by persons of ordinary skill in the art without creative efforts based on the embodiments of the present invention also fall within the scope of the present invention.

Embodiment 1

Figure 1:
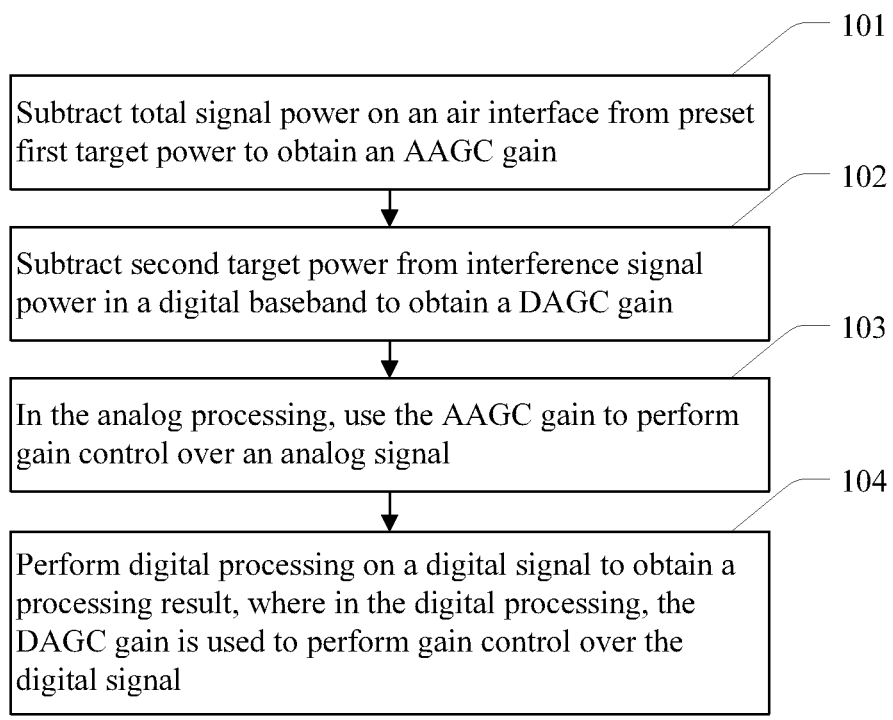
FIG. 1 is a flowchart of an AGC method in a radio receiver according to a first embodiment of the present invention.

This embodiment of the present invention provides an AGC method in a radio receiver. As shown in FIG. 1, the method includes:

Step 101: Subtract total signal power on an air interface from preset first target power to obtain an AAGC gain.

Step 102: Subtract second target power from interference signal power in a digital baseband to obtain a DAGC gain.

Step 103: Perform analog processing and analog-to-digital conversion on an analog signal of the radio receiver to obtain a digital signal, where in the analog processing, the AAGC gain is used to perform gain control over the analog signal.

Step 104: Perform digital processing on the digital signal to obtain a processing result, where in the digital processing, the DAGC gain is used to perform gain control over the digital signal.

In the AGC method in the radio receiver according to this embodiment of the present invention, the total signal power on the air interface is subtracted from the preset first target power to obtain the AAGC gain, and the AAGC gain is used to perform gain control over the analog signal, thus implementing the function of preventing a radio frequency device and an analog device and various nodes in a digital domain from saturation; and then the second target power is subtracted from the interference signal power in the digital baseband to obtain the DAGC gain, and the DAGC gain is used to perform gain control over the digital signal, thus implementing the function of adjusting useful signal power to a certain power level.

Figure 2:
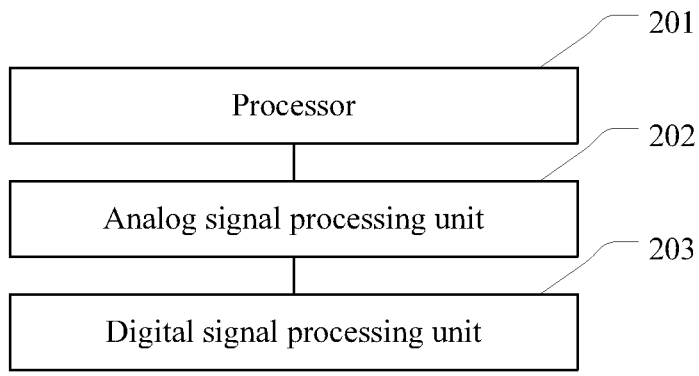
FIG. 2 is a block diagram of an AGC apparatus in a radio receiver according to the first embodiment of the present invention.

In order to implement the foregoing AGC method in the radio receiver, this embodiment provides an AGC apparatus in a radio receiver. As shown in FIG. 2, the apparatus includes: a processor 201, an analog signal processing unit 202, and a digital signal processing unit 203.

The processor 201 is configured to subtract total signal power on an air interface from preset first target power to obtain an AAGC gain, and subtract second target power from interference signal power in a digital baseband to obtain a DAGC gain.

The analog signal processing unit 202 is configured to perform analog processing and analog-to-digital conversion on an analog signal of the radio receiver to obtain a digital signal, where in the analog processing, the AAGC gain is used to perform gain control over the analog signal.

The digital signal processing unit 203 is coupled to the analog signal processing unit and configured to perform digital processing on the digital signal to obtain a processing result, where in the digital processing, the DAGC gain is used to perform gain control over the digital signal.

In the AGC apparatus in a radio receiver according to this embodiment of the present invention, after the processor obtains the AAGC gain, the analog signal processing unit uses the AAGC gain to perform gain control over the analog signal, thus implementing the function of preventing the radio frequency device and the analog device and the various nodes in the digital domain from saturation; then the processor obtains the DAGC gain, and the digital signal processing unit uses the DAGC gain to perform gain control over the digital signal, thus implementing the function of adjusting the useful signal power to a certain power level, so as to determine an AGC gain to be used in a next period.

Embodiment 2

This embodiment of the present invention provides an AGC method in a radio receiver. It should be noted that in this embodiment of the present invention, DAGC is introduced in a digital time domain, so that an original AGC function may be implemented by two parts, namely, AAGC and the DAGC.

Figure 3:
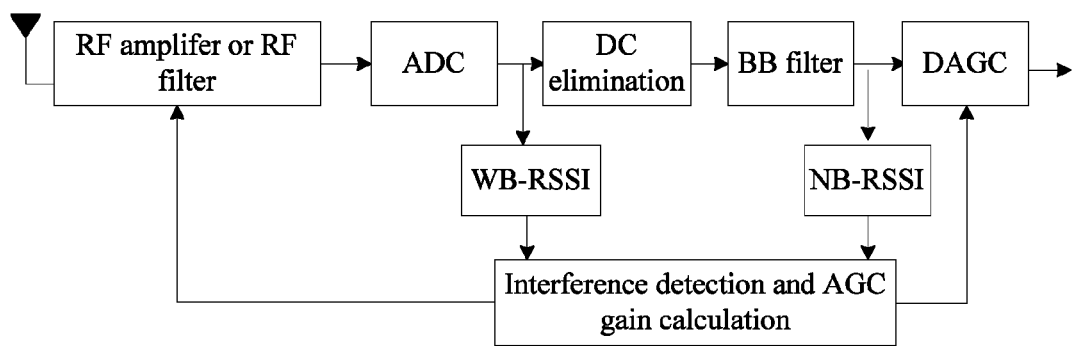
FIG. 3 is an architecture diagram of a receiver according to a second embodiment of the present invention.

For example, in an architecture diagram of a receiver shown in FIG. 3, after an antenna receives a signal, a Radio frequency (RF) amplifier or RF filter module amplifies the signal and performs RF filter processing on the signal; after the processed analog signal is converted into a digital signal by an ADC, statistics about signal power of a WB-RSSI is collected, and baseband (BB) filter processing is performed on the digital signal whose direct current (DC) is eliminated; at this time, statistics about the signal power of a current NB-RSSI is collected; and an AGC gain calculation is performed on the signal power of the current WB-RSSI and the signal power of the current NB-RSSI, where statistics about the signal power of the current NB-RSSI and statistics about the signal power of the current WB-RSSI are collected, and the AGC gain includes the DAGC gain and the AAGC gain. The calculated DAGC gain is used to control the digital signal, and the AAGC gain is used to control the analog signal.

Figure 4:
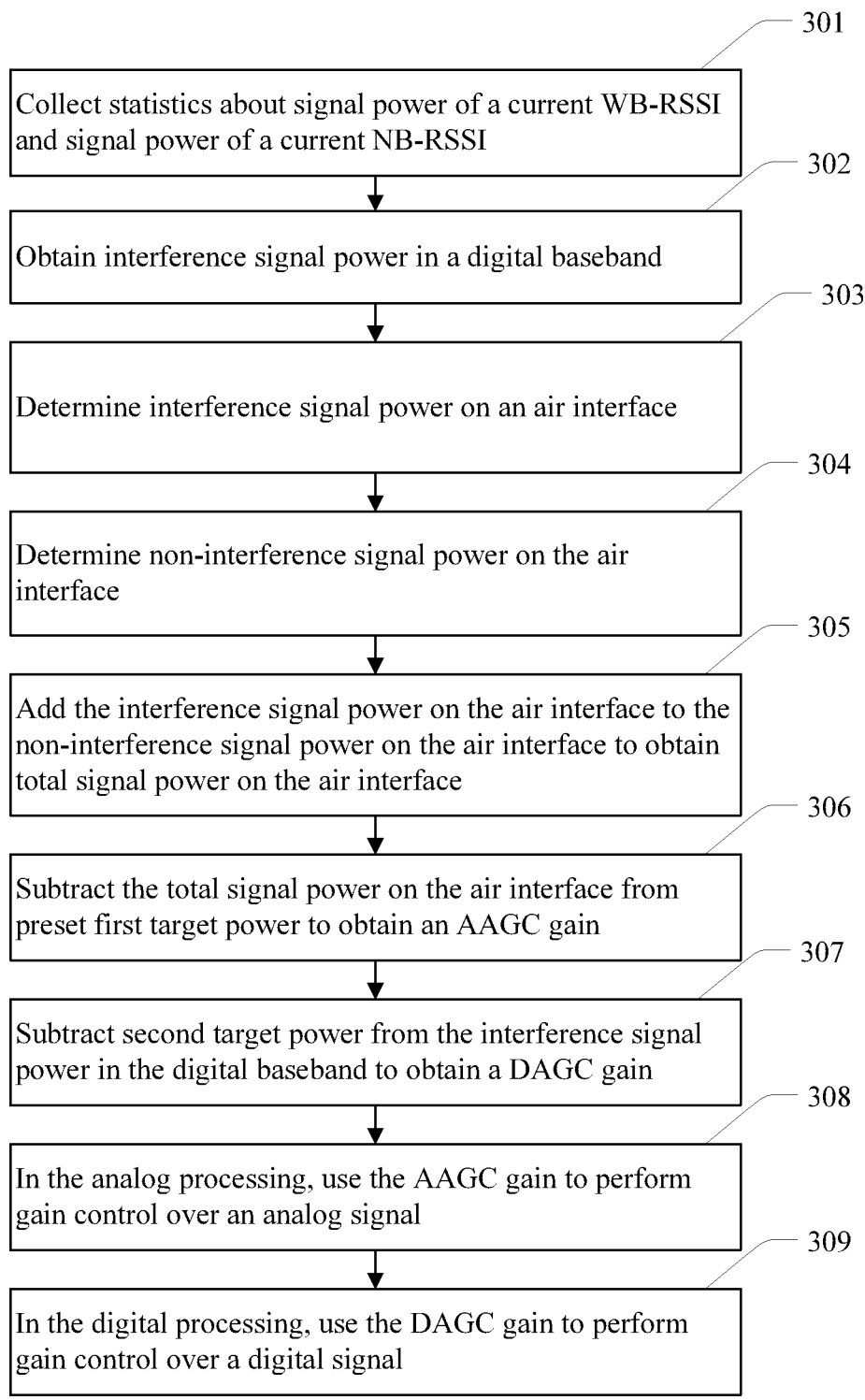
FIG. 4 is a flowchart of an AGC method in a radio receiver according to the second embodiment of the present invention.

Specifically, an AGC method in a radio receiver is as shown in FIG. 4. The method includes:

Step 301: Collect statistics about signal power of a current WB-RSSI and signal power of a current NB-RSSI.

The RSSI is a received signal strength indication. The WB-RSSI refers to a RSSI obtained by collecting statistics about data that has passed through the ADC in the receiver, and the signal power of the WB-RSSI includes signal power outside a useful signal bandwidth, that is, the signal power of the WB-RSSI includes some undesired power of useless signals. The NB-RSSI refers to a RSSI obtained by collecting statistics about signal data that has passed through a filter, and does not include signal power outside the useful signal bandwidth, that is, the signal power of the NB-RSSI is power of a useful signal and is signal power obtained after interference and noise are eliminated from the signal power of the WB-RSSI.

Step 302: Obtain interference signal power in a digital baseband.

Specifically, the interference signal power in the digital baseband is obtained by subtracting the signal power of the current NB-RSSI from the signal power of the current WB-RSSI, where statistics about the signal power of the current NB-RSSI and statistics about the signal power of the current WB-RSSI are collected.

Step 303: Determine interference signal power on an air interface according to $$W = A - 10\ \log_{10}\left(1 - 10^{\frac{Y}{10}}\right) + X,$$

where W is interference signal power on an air interface, A is interference signal power in a digital baseband, X is a capability of a radio frequency filter to suppress preset interference, and Y is a capability of a baseband filter to suppress the preset interference.

The radio frequency filter is mainly used in an electronic device operating at a high frequency and is used for filtering for significantly attenuating a high-frequency interference signal generated by a high-frequency electronic device.

In addition, a blocking problem of a radio frequency device may be solved by the capability of the radio frequency filter to suppress the preset interference and the capability of the baseband filter to suppress the preset interference in conjunction with the interference signal power in the digital baseband.

The interference signal power on the air interference includes a currently-used AGC gain.

Step 304: Determine non-interference signal power on the air interface according to $$P = B - \left(A - 10\ \log_{10}\left(1 - 10^{\frac{Y}{10}}\right)\right),$$

where P is non-interference signal power on the air interface, B is signal power of a current WB-RSSI, and Y is the capability of the baseband filter to suppress the preset interference.

Step 305: Add the interference signal power on the air interface to the non-interference signal power on the air interface to obtain total signal power on the air interface.

Specifically, the total signal power on the air interface may be obtained according to M=W+P=B+X, where M is the total signal power on the air interface, W is the interference signal power on the air interface, P is the non-interference signal power on the air interface, B is the signal power of the current WB-RSSI, and X is the capability of the radio frequency filter to suppress the preset interference.

The total signal power on the air interface may also be calculated and obtained by adding the signal power of the current WB-RSSI to the capability of the radio frequency filter to suppress the preset interference, and the total signal power on the air interface includes the currently-used AAGC gain. Generally, the currently-used AAGC gain needs to be subtracted when a new AAGC gain is calculated.

Step 306: Subtract the total signal power on the air interface from preset first target power to obtain an AAGC gain.

The preset first target power is a preset target power of an input port of the ADC. The preset target power of the input port of the ADC is set by a system worker according to actual experience, is an upper limit, and is the sum of the total signal power on the air interface and the AAGC gain, so that the total signal power on the air interface, where the total signal power on the air interface is received by the radio frequency device for receiving a signal after AAGC, does not exceed the upper limit. The obtained AAGC gain may implement the function of ensuring that a radio frequency device and an analog device and various nodes in a digital domain are non-saturated or as less saturated as possible. The non-saturation refers to falling within an operating range of an analog domain (for example, falling beyond a linear area), or within a range that can be represented by a valid bit width in the digital domain.

Step 307: Subtract second target power from the interference signal power in the digital baseband to obtain a DAGC gain.

The second target power is obtained by subtracting Tb from Ta, where Ta is the target power of the WB-RSSI, and Tb is the target power of the NB-RSSI. Values of the target power of the WB-RSSI and the target power of the NB-RSSI may be set by a working staff according to different systems.

Specifically, the DAGC gain is calculated according to Q=A−(Ta−Tb)=A+Tb−Ta, where Q is the DAGC gain, A is the interference signal power in the digital baseband, Ta is the target power of the WB-RSSI, Tb is the target power of the NB-RSSI, and Ta−Tb is the target power of the interference signal in the digital baseband. The obtained DAGC gain may implement the function of ensuring that the useful signal power is adjusted to a certain power level.

Step 306 and step 307 respectively calculate the AAGC gain and the DAGC gain, that is, AGC gains that may be used in a next period.

Step 308: Perform analog processing and analog-to-digital conversion on an analog signal of the radio receiver to obtain a digital signal, where in the analog processing, the AAGC gain is used to perform gain control over the analog signal.

Using the AAGC gain to perform gain control over the analog signal may implement the function of ensuring that the radio frequency device and the analog device and the various nodes in the digital domain are non-saturated or as less saturated as possible.

Step 309: Perform digital processing on the digital signal to obtain a processing result, where in the digital processing, the DAGC gain is used to perform gain control over the digital signal.

Using the DAGC gain to perform gain control over the digital signal may implement the function of ensuring that the useful signal power is adjusted to a certain power level.

It should be noted that, if the AGC gain function is implemented only by adjusting the analog domain, in order to ensure that the power of the signal is adjusted to the target power in the digital domain, the gain in the analog domain may be excessive, so that part of nodes exceed an optimum operating range. If the DAGC is added, the AAGC does not need to adjust the signal to the target power and only needs to adjust the signal as close to the target power in the digital domain as possible while ensuring non-saturation. Thus, non-saturation is ensured. Therefore, in use, the AAGC gain may be used to ensure the function that the radio frequency device and the analog device and the various nodes in the digital domain are non-saturated.

Assume that the target power of the AGC is E dB and that the signal power after the AAGC adjustment is F dB, the signal power of the DAGC is (E−F) dB, and the signal power of the DAGC may reach the level of the target power in the digital domain after being amplified by the DAGC. Therefore, the DAGC gain is used to ensure that the useful signal power is adjusted to a certain power level.

Therefore, the AAGC gain and the DAGC gain may be used respectively to ensure the two functions of the AGC gain.

In the AGC method in the radio receiver according to this embodiment of the present invention, the AAGC gain and the DAGC gain are obtained respectively to determine the AGC function to be used in the next period, the AAGC gain may be used to implement the function of preventing the radio frequency device and the analog device and the various nodes in the digital domain from saturation, and the DAGC gain may be used to implement the function of adjusting the useful signal power to a certain power level. It may be understood that the sequence between different steps in the embodiments of the present invention is not strict and may be adjusted adaptively.

Figure 5:
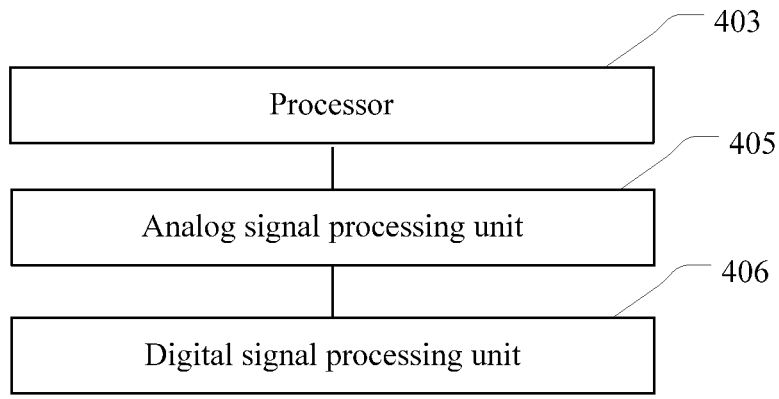
FIG. 5 is a block diagram of an AGC apparatus in a radio receiver according to the second embodiment of the present invention.

In order to implement the AGC method in the radio receiver, an embodiment of the present invention provides an AGC apparatus in a radio receiver. As shown in FIG. 5, the apparatus includes: a processor 403, configured to subtract total signal power on an air interface from preset first target power to obtain an AAGC gain, and subtract second target power from interference signal power in a digital baseband to obtain a DAGC gain; an analog signal processing unit 405, configured to perform analog processing and analog-to-digital conversion on an analog signal of the radio receiver to obtain a digital signal, where in the analog processing, the AAGC gain is used to perform gain control over the analog signal; and a digital signal processing unit 406, coupled to the analog signal processing unit, and configured to perform digital processing on the digital signal to obtain a processing result, where in the digital processing, the DAGC gain is used to perform gain control over the digital signal.

Figure 6:
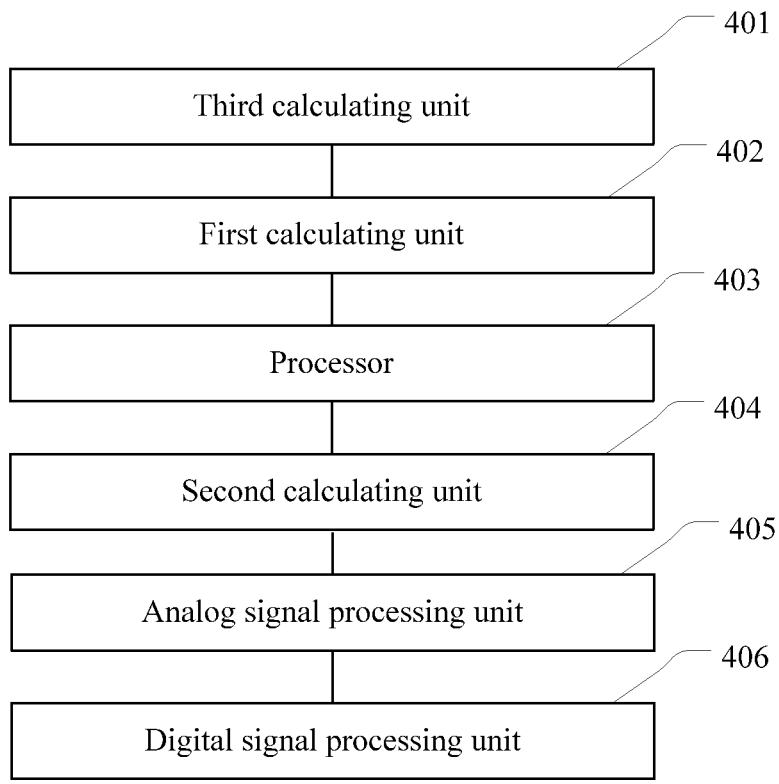
FIG. 6 is a block diagram of another AGC apparatus in a radio receiver according to the second embodiment of the present invention.

Further, in order to improve the foregoing apparatus, an embodiment of the present invention provides another AGC apparatus in a radio receiver. As shown in FIG. 6, the apparatus includes: a third calculating unit 401, a first calculating unit 402, a processor 403, a second calculating unit 404, an analog signal processing unit 405, and a digital signal processing unit 406.

Statistics about signal power of a current WB-RSSI and statistics about signal power of a current NB-RSSI are collected, and then the third calculating unit 401 subtracts the signal power of the current NB-RSSI from the signal power of the current WB-RSSI to obtain the interference signal power in the digital baseband. The unit 401 may be an independent calculator, as shown in FIG. 6; certainly, in another implementation, the function of calculating the interference signal power in the digital baseband may be implemented by the processor 403.

The first calculating unit 402 is configured to add interference signal power on the air interface to non-interference signal power on the air interface to obtain total signal power on the air interface. Specifically, the first calculating unit 402 is also configured to determine the interference signal power on the air interface according to $$W = A - 10 \log_{10}\left(1 - 10^{\frac{Y}{10}}\right) + X,$$

and determine the non-interference signal power on the air interface according to $$P = B - \left(A - 10 \log_{10}\left(1 - 10^{\frac{Y}{10}}\right)\right),$$

where W is the interference signal power on the air interface, P is the non-interference signal power on the air interface, A is the interference signal power in the digital baseband, B is the signal power of the current WB-RSSI, X is a capability of a radio frequency filter to suppress preset interference, and Y is a capability of a baseband filter to suppress the preset interference. The unit 402 may be an independent calculator, as shown in FIG. 6; certainly, in another implementation, the function of calculating the interference signal power in the digital baseband may be implemented by the processor 403.

After the first calculating unit 402 determines the total signal power on the air interface, the processor 403 is configured to subtract the total signal power on the air interface from the preset first target power to obtain the AAGC gain, and subtract the second target power from the interference signal power in the digital baseband to obtain the DAGC gain.

The preset first target power is a preset target power of an input port of an ADC. The preset target power of the input port of the ADC is set by a working staff according to actual experience, is an upper limit, and is the sum of the total signal power on the air interface and the AAGC gain, so that the total signal power on the air interface, where the total signal power on the air interface is received by a radio frequency device for receiving a signal after AAGC, does not exceed the upper limit.

The second target power is obtained by the second calculating unit 404, and specifically, the second target power is obtained by subtracting Tb from Ta, where Ta is the target power of the WB-RSSI, Tb is the target power of the NB-RSSI, and values of the target power of the WB-RSSI and the target power of the NB-RSSI may be set by a working staff according to different systems. The unit 404 may be an independent calculator, as shown in FIG. 6; certainly, in another implementation, the function of calculating the interference signal power in the digital baseband may also be implemented by the processor 403.

Specifically, the unit 404 may calculate the DAGC gain according to Q=A−(Ta−Tb)=A+Tb−Ta, where Q is the DAGC gain, A is the interference signal power in the digital baseband, Ta is the target power of the WB-RSSI, Tb is the target power of the NB-RSSI, and Ta−Ta is the target power of the interference signal in the digital baseband. The obtained DAGC gain may implement the function of ensuring that useful signal power is adjusted to a certain power level.

The obtained AAGC gain and DAGC gain are AGC gains to be used in a next period. Specifically, the analog signal processing unit 405 is configured to perform analog processing and analog-to-digital conversion on an analog signal of the radio receiver to obtain a digital signal, where in the analog processing, the AAGC gain is used to perform gain control over the analog signal. The analog signal processing unit 405 may include a RF amplifier, a filter, and the ADC in FIG. 3, and may also include some other possible analog baseband processing modules and units for processing an analog signal.

The digital signal processing unit 406 is coupled to the analog signal processing unit and configured to perform digital processing on the digital signal to obtain a processing result, where in the digital processing, the DAGC gain is used to perform gain control over the digital signal. The digital signal processing unit 406 may include a DC eliminating unit as shown in FIG. 3, a digital baseband filter processing unit, and some other possible units for processing a digital signal.

In the AGC apparatus in a radio receiver according to this embodiment of the present invention, the processor obtains the AAGC gain and the DAGC gain, and then the analog signal processing unit uses, in the analog processing, the AAGC gain to perform gain control over the analog signal, which may implement the function of preventing a radio frequency device and an analog device and various nodes in the digital domain from saturation; and the digital signal processing unit uses, in the digital processing, the DAGC gain to perform gain control over the digital signal, which may implement the function of adjusting the useful signal power to a certain power level.

The solutions of the embodiments of the present invention may not only be applied in a Long-Term Evolution (LTE) system, but also be used in other radio communication systems using an orthogonal frequency-division multiplexing (OFDM) technology, such as Worldwide Interoperability for Microwave Access (WiMax). Generally, the apparatus takes the form of hardware, such as an integrated circuit (IC), and is built into a radio receiver. Certainly, the apparatus may also take the form of a printed circuit board (PCB).

Under certain circumstances, all or part of the methods may also be stored in a computer readable storage medium in the form of computer software codes. Therefore, all or part of the technical solutions of the methods may be embodied in the form of a software product. The software product is stored in a storage medium and includes several instructions to enable a computer device (which may be a personal computer, a server, or a network device) to execute all or part of the steps of the methods described in the embodiments of the present invention. The storage medium may be any medium that can store program codes, such as a Universal Serial Bus (USB) disk, a removable hard disk, a read only memory (ROM), a random access memory (RAM), a magnetic disk, and a Compact Disc Read-only Memory (CD-ROM).

The foregoing description is only exemplary embodiments of the present invention, but is not intended to limit the scope of the present invention. Any variation or replacement that may be easily through of by persons skilled in the art within the technical scope of the present invention shall fall within the scope of the present invention. Therefore, the scope of the present invention is subject to the appended claims.

What is claimed is:

1. A method for auto gain control (AGC) in a radio receiver, comprising:
   subtracting a total signal power on an air interface from a preset first target power to obtain an analog auto gain control (AAGC) gain;
   subtracting a second target power from an interference signal power in a digital baseband to obtain a digital auto gain control (DAGC) gain;
   performing analog processing and analog-to-digital conversion on an analog signal of the radio receiver to obtain a digital signal, wherein in the analog processing, the AAGC gain is used to perform gain control over the analog signal; and
   performing digital processing on the digital signal to obtain a processing result, wherein in the digital processing, the DAGC gain is used to perform gain control over the digital signal.

2. The AGC method in the radio receiver according to claim 1, further comprising adding an interference signal power on the air interface to a non-interference signal power on the air interface to obtain the total signal power on the air interface.

3. The AGC method according to claim 2, further comprising:
   determining the interference signal power on the air interface according to $$W = A - 10\ \log_{10}\left(1 - 10^{\frac{Y}{10}}\right) + X;$$

and
   determining the non-interference signal power on the air interface according to $$P = B - \left(A - 10\ \log_{10}\left(1 - 10^{\frac{Y}{10}}\right)\right),$$

wherein W is the interference signal power on the air interface,
   wherein P is the non-interference signal power on the air interface,
   wherein A is the interference signal power in the digital baseband,
   wherein B is signal power of a current wideband RSSI,
   wherein X is a capability of a radio frequency filter to suppress preset interference, and
   wherein Y is a capability of a baseband filter to suppress the preset interference.

4. The AGC method in the radio receiver according to claim 1, wherein the second target power is obtained by subtracting Tb from Ta, wherein Ta is a target power for a wideband RSSI, and Tb is a target power for a narrowband RSSI.

5. The AGC method in the radio receiver according to claim 1, wherein the interference signal power in the digital baseband is obtained by subtracting a signal power of a current narrowband RSSI from a signal power of a current wideband RSSI.

6. An apparatus for auto gain control (AGC) in a radio receiver, comprising:

a processor configured to:

subtract total signal power on an air interface from preset first target power to obtain an analog auto gain control (AAGC) gain; and subtract second target power from interference signal power in a digital baseband to obtain a digital auto gain control (DAGC) gain;

an analog signal processing unit configured to perform analog processing and analog-to-digital conversion on an analog signal of the radio receiver to obtain a digital signal, wherein in the analog processing, the AAGC gain is used to perform gain control over the analog signal; and a digital signal processing unit coupled to the analog signal processing unit, wherein the digital signal processing unit is configured to perform digital processing on the digital signal to obtain a processing result, and wherein in the digital processing, the DAGC gain is used to perform gain control over the digital signal.

7. The apparatus according to claim 6, further comprising a first calculating unit configured to add an interference signal power on the air interface to a non-interference signal power on the air interface to obtain the total signal power on the air interface.

8. The apparatus according to claim 7, wherein the first calculating unit is further configured to:

determine the interference signal power on the air interface according to $$W = A - 10 \log_{10}\left(1 - 10^{\frac{Y}{10}}\right) + X;$$

and determine the non-interference signal power on the air interface according to $$P = B - \left(A - 10 \log_{10}\left(1 - 10^{\frac{Y}{10}}\right)\right),$$

wherein W is the interference signal power on the air interface, wherein P is the non-interference signal power on the air interface, wherein A is the interference signal power in the digital baseband, wherein B is signal power of a current wideband RSSI (WB-RSSI), wherein X is a capability of a radio frequency filter to suppress preset interference, and wherein Y is a capability of a baseband filter to suppress the preset interference.

9. The apparatus according to claim 6, further comprising a second calculating unit configured to obtain the second target power by subtracting Tb from Ta, wherein Ta is a target power of a WB-RSSI, and Tb is a target power of a narrowband RSSI.

10. The apparatus according to claim 6, further comprising a third calculating unit, configured to subtract a signal power of a current narrowband RSSI from a signal power of the current wideband RSSI to obtain the interference signal power in the digital baseband.

* * * * *